United States Patent
Cai et al.

(10) Patent No.: US 9,611,999 B2
(45) Date of Patent: Apr. 4, 2017

(54) REFLECTING APPARATUS INCLUDING ENHANCED ALUMINUM OPTICAL COATINGS

(71) Applicant: GE Lighting Solutions, LLC, East Cleveland, OH (US)

(72) Inventors: Dengke Cai, Willoughby, OH (US); Mark J. Mayer, East Cleveland, OH (US); Koushik Saha, East Cleveland, OH (US); Benjamin James Ward, East Cleveland, OH (US); Tianji Zhao, East Cleveland, OH (US)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 14/336,156

(22) Filed: Jul. 21, 2014

(65) Prior Publication Data

US 2016/0018080 A1  Jan. 21, 2016

(51) Int. Cl.
| | |
|---|---|
| H01L 33/60 | (2010.01) |
| H01L 33/40 | (2010.01) |
| F21V 7/22 | (2006.01) |
| G02B 5/08 | (2006.01) |
| F21Y 101/00 | (2016.01) |
| F21K 9/233 | (2016.01) |

(52) U.S. Cl.
CPC ................. F21V 7/22 (2013.01); G02B 5/08 (2013.01); *F21K 9/233* (2016.08); *F21Y 2101/00* (2013.01); *H01L 33/405* (2013.01); *H01L 33/60* (2013.01)

(58) Field of Classification Search
CPC .............................. H01L 33/60; H01L 33/405
See application file for complete search history.

(56) References Cited

U.S. PATENT DOCUMENTS

| | | | | |
|---|---|---|---|---|
| 4,461,532 A | * | 7/1984 | Sato | G02B 5/282 |
| | | | | 359/359 |
| 4,850,661 A | * | 7/1989 | Kawakatsu | G02B 5/282 |
| | | | | 359/359 |
| 4,856,019 A | * | 8/1989 | Miyata | G02B 5/0891 |
| | | | | 359/585 |
| 5,179,318 A | * | 1/1993 | Maeda | C23C 14/081 |
| | | | | 313/112 |
| 5,337,191 A | * | 8/1994 | Austin | C03C 17/36 |
| | | | | 359/359 |

(Continued)

FOREIGN PATENT DOCUMENTS

| | | |
|---|---|---|
| EP | 0568943 A1 | 11/1993 |
| EP | 2418521 A2 | 2/2012 |

(Continued)

*Primary Examiner* — Ida M Soward
(74) *Attorney, Agent, or Firm* — GE Global Patent Operation; Peter T. DiMauro

(57) ABSTRACT

A multi-reflector lighting apparatus including a reflector having a reflecting layer deposited on a base layer. The multi-reflector lighting apparatus further includes a first oxide layer deposited on the reflecting layer. The multi-reflector lighting apparatus further includes a second oxide layer deposited on the first oxide layer. The multi-reflector lighting apparatus further includes an alternating plurality of a relatively low refractive index oxide layer material and a relatively high refractive index oxide layer material deposited on the second oxide layer.

2 Claims, 3 Drawing Sheets

(56) References Cited

U.S. PATENT DOCUMENTS

| | | | | |
|---|---|---|---|---|
| 5,432,812 A * | 7/1995 | Kurobe | ............... | B82Y 20/00 |
| | | | | 372/108 |
| 5,464,683 A * | 11/1995 | Rudigier | ............. | C03C 17/3435 |
| | | | | 428/216 |
| 5,772,862 A * | 6/1998 | Ando | ............... | B32B 17/10174 |
| | | | | 204/192.15 |
| 5,944,964 A * | 8/1999 | Solberg | ............... | C03C 17/3417 |
| | | | | 204/192.12 |
| 6,067,189 A | 5/2000 | Gillich | | |
| 6,709,119 B2 * | 3/2004 | Gillich | ............... | G02B 1/105 |
| | | | | 359/584 |
| 7,285,436 B2 * | 10/2007 | Nakatsu | ............. | H01L 33/0095 |
| | | | | 257/88 |
| 7,478,930 B2 * | 1/2009 | Choi | ............... | G02F 1/133603 |
| | | | | 362/330 |
| 8,159,748 B2 * | 4/2012 | Fukui | ............... | C23C 14/0676 |
| | | | | 359/580 |
| 9,279,982 B2 * | 3/2016 | Hirose | ............... | C08J 7/042 |
| 2003/0048554 A1 | 3/2003 | Gillich et al. | | |
| 2005/0083460 A1 * | 4/2005 | Hattori | ............. | G02F 1/133555 |
| | | | | 349/114 |
| 2005/0213199 A1 * | 9/2005 | Imai | ............... | B82Y 10/00 |
| | | | | 359/359 |
| 2006/0087739 A1 * | 4/2006 | Ockenfuss | ............. | G02B 5/285 |
| | | | | 359/588 |
| 2007/0040966 A1 * | 2/2007 | Teramoto | ............... | G03B 21/28 |
| | | | | 349/113 |
| 2008/0258043 A1 * | 10/2008 | Suzuki | ............... | G02B 5/282 |
| | | | | 250/208.1 |
| 2010/0104838 A1 * | 4/2010 | Noguchi | ............... | G02B 1/115 |
| | | | | 428/212 |
| 2011/0085233 A1 * | 4/2011 | Furusato | ............... | G02B 1/115 |
| | | | | 359/359 |
| 2012/0026580 A1 * | 2/2012 | Kiyoto | ............... | G02B 5/281 |
| | | | | 359/359 |
| 2013/0128342 A1 * | 5/2013 | Mitarai | ............. | B32B 17/10036 |
| | | | | 359/359 |
| 2015/0219810 A1 * | 8/2015 | Taka | ............... | G02B 5/0841 |
| | | | | 359/584 |
| 2015/0293284 A1 * | 10/2015 | Tatemura | ............... | G02B 5/282 |
| | | | | 359/359 |

FOREIGN PATENT DOCUMENTS

| | | |
|---|---|---|
| EP | 2530496 A1 | 12/2012 |
| WO | 2010112122 A1 | 10/2010 |

\* cited by examiner

REFLECTING APPARATUS INCLUDING ENHANCED ALUMINUM OPTICAL COATINGS

I. TECHNICAL FIELD

The present invention relates generally to light reflectors. More particularly, the present invention relates to reflector apparatus having enhanced aluminum optical coatings including alternating refractive index optical coatings tuned for apparatus geometries and optics related to a light source such as a light-emitting diode (LED) array or cluster.

II. BACKGROUND

Traditionally, light-emitting diodes have been used mostly as indicator lights for a wide variety of devices. Due to advances in diode light intensity and color quality, modern LEDs are being used increasingly for area lighting applications, such as in indoor or outdoor lighting fixtures.

Reflectors/housings for LED and other lighting systems are typically metal or at least metal coated. Metal reflectors for lighting applications, most commonly incorporating aluminum and more rarely silver or other metals on the reflective surface, are widely used because their reflectivity is high, and largely insensitive to the incident angle of the light and they are amenable to the construction of a range of reflector shapes. Metals, though, exhibit limited reflectivity due to surface finish, degradation during processing (e.g. oxidation and surface contamination), and the application of protective coatings.

Other reflectors include a coating of thin films, such as polymeric or dielectric layers. The latter type can be referred to as a dielectric mirrors, or Bragg reflectors which use quarter wave designs A related term is a dichroic stack, mirror, or reflector, which has both quarter wave or non quarter wave designs Polymer stacks have shortcomings including relatively-low robustness. Polymer stacks, being an example of non-dielectric stacks, can operate decently within only limited temperature range, for example. The polymer stacks can also break down when exposed to ultraviolet (UV) light, which can be generated by an LED or a high-intensity discharge (HID) light source. Non-dielectric stacks, e.g., polymer stacks, may also susceptible undesirably to water uptake and swelling.

Current reflective coatings for LED reflectors are typically vacuum coated aluminum. In theory, the reflectivity of vacuum coated reflectors is 91% in theory, but in practice is typically about 80%. As mentioned herein, silver can also be implemented. Silver provides improved performance for LED street lighting or parking lot lighting. Silver has much higher reflectivity than aluminum, typically about 98%. Silver has the drawback of requiring protection from tarnishing. Sulphides, water vapor, oxygen, carbinates in both molecular and atomic and ionic attack silver. Silver protection may be unreliable in that the protective layer involves multilayers and may not match the LED life.

III. SUMMARY OF THE EMBODIMENTS

Given the aforementioned deficiencies, there is a need for an improved lighting system having high-performance coatings tuned to system geometries and optics to reflect light to high intensities without undesired color separation.

In at least one embodiment, the present technology provides a method including depositing a reflecting layer on a base layer (substrate), depositing a first oxide layer on the reflecting layer, depositing a second oxide layer on the first oxide layer; and depositing an alternating plurality of a relatively low refractive index oxide layer material and a relatively high refractive index oxide layer material on the second oxide layer.

In still another aspect, the present technology includes A multi-reflector lighting apparatus, including a reflector having a reflecting layer deposited on a base layer, a first oxide layer deposited on the reflecting layer, a second oxide layer deposited on the first oxide layer, and an alternating plurality of a relatively low refractive index oxide layer material and a relatively high refractive index oxide layer material deposited on the second oxide layer.

Further features and advantages, as well as the structure and operation of various embodiments, are described in detail below with reference to the accompanying drawings. The invention is not limited to the specific embodiments described herein. The embodiments are presented for illustrative purposes only. Additional embodiments will be apparent to persons skilled in the relevant art(s) based on the teachings contained herein.

IV. BRIEF DESCRIPTION OF THE DRAWINGS

Example embodiments may take form in various components and arrangements of components. Example embodiments are illustrated in the accompanying drawings, throughout which like reference numerals may indicate corresponding or similar parts in the various figures. The drawings are only for purposes of illustrating preferred embodiments and are not to be construed as limiting the invention. Given the following enabling description of the drawings, novel aspects of the present invention will be evident to a person of ordinary skill in the art.

FIG. 1 illustrates schematically an exemplary lighting system or assembly according to one embodiment.

FIG. 2 includes a partial cross-sectional view of a reflector coating of the lighting system of FIG. 1.

V. DETAILED DESCRIPTION OF THE EMBODIMENTS

While illustrative embodiments are described herein with illustrative embodiments for particular implementations, it should be understood that the invention is not limited thereto. Those skilled in the art with access to the teachings provided herein will recognize additional modifications, applications, and embodiments within the scope thereof, and additional fields in which the lighting systems, and included reflector coatings, described herein would be of significant utility.

Figure 1:
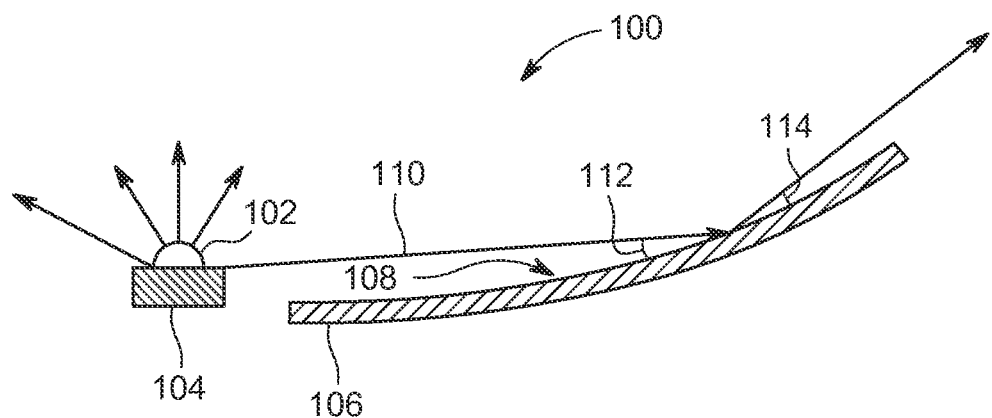

FIG. 1 is an illustration of portions of a lighting assembly system 100. The system 100 includes a light source 102 connected to a base or mount 104. While a single light component or element 102 is illustrated schematically for simplicity of illustration, the light source can include multiple diodes (e.g., LEDs), bulbs, or other lighting elements.

For embodiments in which the light source 102 includes multiple elements, the elements may be arranged in any conventional or to-be-created manner, such as in a lighting array or cluster. Multiple-element arrangements can still be referred to as a (single) light source, herein, for instance.

The lighting system 100 illustrated can be referred to as a multi-reflector system, having multiple reflectors such as reflector 106. While one reflector 106 is shown, the lighting system 100 in various embodiments includes any number of distinct reflectors, whether any of the reflectors are connected directly to each other.

The system 100 in one embodiment includes a single reflector component, e.g., an asymmetrical reflector. However, and while one reflector 106 is shown schematically as a single component, two or more reflectors including the reflector 106 are in some embodiments connected to each other, e.g., directly. The combined reflector of such embodiments, including, e.g., illustrated reflector component 106 of FIG. 1, may share a common substrate or have connecting substrates, for instance.

In embodiments of the present technology, the reflector 106 is coated with a distinct multilayer thin-film reflective stack 108. The stack 108 can include distinct types of layered reflectors—e.g., dielectric mirrors, Bragg reflectors, or dichroic mirrors. The stack 108 in the illustrated embodiment includes multiple relatively thin-stacked layers or films of, e.g., dielectric material. As described further herein, materials of the stacks in some embodiments preferably alternate between a material having a relatively high refractive index and one having a relatively low refractive index. Configurations of high-performance reflectors such as the reflector 106 are stacked and configured within the lighting system 100 and optics, as described further below in connection with FIG. 2.

Before the lighting system 100 is described further, it is noted that some aspects of the system that are not needed for the present description, yet which are used in system operation, construction, or positioning for operation, are not illustrated. For instance, a cover, e.g., cover lens, of the lighting system 100 is not shown, or components connecting the light source 102 to the reflector 106.

In FIG. 1, multiple example light rays are shown schematically, including ray 110. The called out ray 110 impinges on the reflector 106. The light ray 110 arrives at the coating 108 of the reflector 106 and at respective approach (i.e., incident) angle 112. By way of background, the definition of incident angle is not from the surface normal. The ray 110 leaves the coating 108 at a departure angle 114, the reflectivity of which being determined and enhanced by the coating 108 in accordance with embodiments of the present technology.

In an embodiment, enhanced aluminum is implemented with an aluminum base layer, followed by an optical thin film stack, which includes up to 30 or more thin film layers. The thin-film layers are alternating relatively high and relatively low index oxides, for example, $SiO_2$ as a low refractive index material, and $TiO_2$ or $Nb_2O_5$ as a high refractive index material. It is appreciated that several relatively low and relatively high refractive index materials are described herein, and that other materials are contemplated in other embodiments. It is also appreciated that the oxide films are selected to make optical think film stacks that has high reflectivity in the whole visible spectrum, 380 nm to 760 nm.

Figure 2:
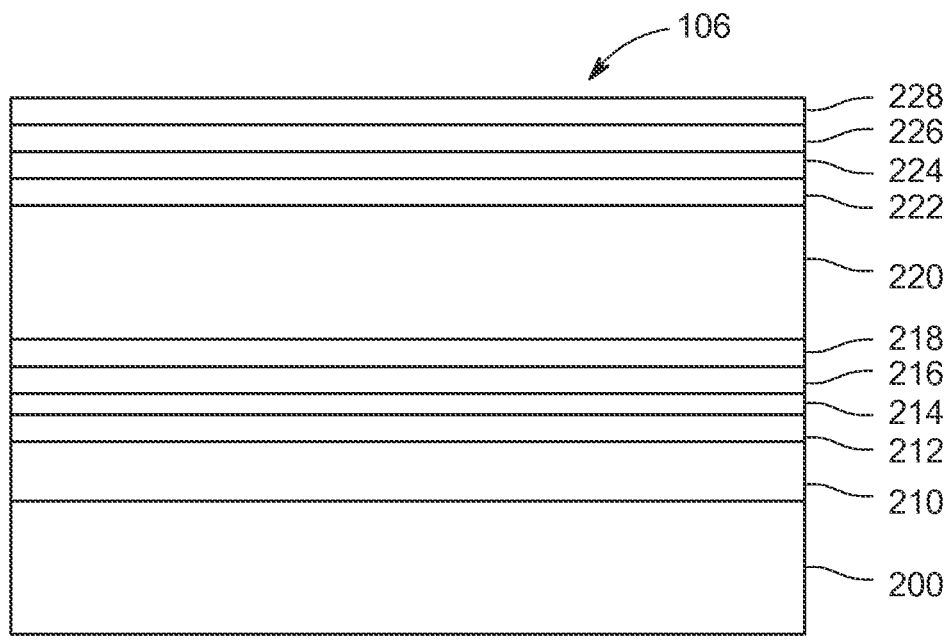

FIG. 2 is a partial cross sections of the example reflector 106 of the lighting system 100 in FIG. 1. Each reflector 106 includes a substrate, or base reflector surface 200. The base reflector surfaces 200 may include any of a variety of materials, such as but not limited to an injection molded plastic substrate material, glass, low cost polycarbonate and the like.

The base reflector surface 200 is a non-reflective or minimally reflective layer.

As described herein the lighting system 100 may include several reflectors, such as reflector 106, which can be combined and have a common base reflector surface such as base reflector surface 200.

The reflector 106 further includes a reflecting layer 210. The reflecting layer 210 is a high reflecting material such as aluminum.

As shown in FIG. 2, the thin-film reflective stack 108 includes multiple layers positioned directly adjacent (i.e., directly atop, in the view of FIG. 2) the base reflector surface 200 and reflecting layer 210. Various characteristics or factors define the stack 108. Characteristics include a number, size (e.g., thickness), shape, and material of stack layers. One or more of the characteristics are, according to the present technology, a function of lighting system 100 geometry and optics. The system geometry factors can include a configuration (e.g., size and shape) and arrangement (e.g., positioning and orientation) of the reflectors such as the reflector 106 in the system 100. The optical factors can include at least those resulting from the system geometry, such as the incident angles of light on the light stack 108. The optical factors can also include color presence or distribution (e.g., wavelength range, or median wavelength, etc.) of the light to arrive at the stacks.

The stack 108 in FIG. 2 includes first four layers 212, 214, 216, 218. In one embodiment, the first four layers 212, 214, 216, 218 are alternating relatively low refractive index material (e.g., $SiO_2$), and relatively high refractive index material (e.g., $TiO_2$ or $Nb_2O_5$). The stack 108 also includes last four layers 222, 224, 226, 228. In one embodiment, the last four layers 222, 224, 226, 228 are also alternating relatively low refractive index material (e.g., $SiO_2$), and relatively high refractive index material (e.g., $TiO_2$ or $Nb_2O_5$). The stack 108 in FIG. 2 further illustrates a mid layer 220, which actually represents a middle several layers of alternating relatively low refractive index materials and relatively high refractive index materials. A single representative layer, such as mid layer 220, is illustrated for clarity purposes. As such, it is appreciated that mid layer 220 is illustrative of multiple layers as described.

As described herein, the reflecting aluminum layer 210 is followed by an optical thin film stack, which includes up to 30 or more thin film layers, which are alternating relatively high and relatively low index oxides. As such, the mid layer 220 can include 22 or more layers (30 or more layers minus the first four layers 222, 224, 226, 228 and the last four layers 222, 224, 226, 228 (30−4−4=22)).

In other embodiments, the stack 108 can include any desired number of layers. The number of layers can be even or odd. In one embodiment, each stack 208 includes an even number of layers greater than 26—e.g., 28 layers, 30 layers, 32 layers, 34 layers, 36 layers, etc. In one embodiment, each stack 208 includes an odd number of layers greater than 26—e.g., 27 layers, 29 layers, 31 layers, 33 layers, 35 layers, etc.

The layers can include any of a variety of materials. In some embodiments, each layer consists preferably of a dielectric material. In some embodiments, each stack 108 includes at least two different material layers, such as two different dielectric materials. The layers can vary by is their characteristic of refractive index. In a contemplated embodiment, at least one of the layers is a non-dielectric.

In one embodiment, the layers of each stack 108 include alternating layers of a first material (e.g., first dielectric material) having a relatively high refractive index and a second material (e.g., second dielectric material) having a relatively low refractive index. In this alternating arrangement, each relatively-high refractive index material can be the same, and each relatively-low refractive index material can be the exact same, but that need not be the case in every implementation.

For some implementations, it is preferred that the number of layers be odd. In at least one of those implementations, it is preferred that the lowest layer (e.g., layer 221), directly adjacent the reflecting layer 210 include a relatively-low refractive index film, and so that the final layer (e.g., layer 228) also include a relatively-low refractive index film.

For some implementations, it is preferred that the number of layers be odd. In at least one of those implementations, it is preferred that the lowest layer, directly adjacent the reflecting layer 210 (e.g., the layer 212) include a relatively-high refractive index film, and so that the final layer (e.g., the layer 228) also include a relatively-high refractive index film.

For some implementations, it is preferred that the number of layers be even. In at least one of those implementations, it is preferred that the lowest layer (e.g., the layer 212), directly adjacent the reflecting layer 210 include a relatively-low refractive index film and that the final layer (e.g., the layer 228) include a relatively-high refractive index film. For some implementations having an even number of layers, it is preferred that the lowest layer (e.g., the layer 212), directly adjacent the reflecting layer 210 include a relatively-high refractive index film and that the final layer (e.g., the layer 228) include a relatively-low refractive index film.

The refractive index (n) of a material is the ratio of the speed of light in vacuum (c) and the speed of light within the material (v), or n=c/v. While the materials used in an dielectric stack may have other refractive indexes, in one of the embodiments having an alternating high-index/low-index arrangement, relatively-high refractive indexes are between about n=2.0 and about n=2.6 nm—e.g., about n=2.4, and relatively-low refractive indexes are between about n=1.4 and about n=1.6—e.g., about n=1.5.

In FIG. 2, the stack 108 begins with a low, or least relatively low, refractive index layer 212 positioned directly adjacent, and contacting directly, the reflecting layer 210. According to the alternating arrangement, the next layer 214 is thus having a high, or relatively high, refractive index.

The final two layers illustrated are, then, continuing with the alternating arrangement, low refractive index layer 226 and high refractive index layer 228.

The layers 212, 214, 216, 218, 220, 222, 224, 226, 228 of the stack 108 can also be set to any of a wide variety of thicknesses. Layer thicknesses for each implementation can be represented by, e.g., a linear measure, such as nanometers (nm) or angstroms (A).

In one embodiment, each layer 212, 214, 216, 218, 220, 222, 224, 226, 228 of the stack 108 has a thickness of between about 30 nm and about 300 nm. In general, the thickness is selected to realize high reflectivity. The relatively low refractive index layers can have a thickness of 50 nm to 300 nm. The relatively high refractive index layers have a thickness of about 30 nm to 200 nm. In one example, the total thickness of a 26-layer stack can be about 3000 nm. The reflecting layer 210 can be between about 200 nm and 400 nm.

The substrate, or base reflector surface 200, and any superstrate affixed to the base reflector surface 200 are in some cases much thicker. In one embodiment, for example, the substrate has a thickness between about 2 mm and about 4 mm—e.g., about 3 mm. Any superstrate can be of similar thickness. The final reflectivity of 26 layer plus the reflecting layer 210 (e.g., aluminum) is about 98%, similar to that of silver.

In one embodiment, the reflecting layer 210 of aluminum has a very high reflectivity. For example, its reflectivity at 550 nm wavelength is 91.61084%. In one embodiment, 550 nm is selected because first 550 nm falls in visible spectrum, and because it takes the maximum value for human eyes. In other words, 550 nm is the most sensitive light to the human eye. This particular wavelength can be seen as a reference wavelength or control wavelength.

In one embodiment, aluminum reflectivity can be enhanced by adding optical interference layers. Light enters the thin film layers first before it hits the aluminum reflecting layer 210. For multilayer thin films described herein, the incident light can be constructed or enhanced as described herein.

In one embodiment, the reflector 106 can be designed as a quarter wave plate. As such, two thin films are implemented, $SiO_2$ and $NbO_2$. $SiO_2$ and are referred to the relatively-low refractive index film, while $NbO_2$ as the relatively-high refractive index film. All the relatively low refractive index films and the relatively-high refractive index films have quarter wave thickness, that is, the relatively-low refractive index film is 137.5 nm thick, or one fourth of control wave 550 nm, and the relatively-high refractive index film=137.5 nm as well, or $NbO_2$ thickness is 137.5 nm. These specifications meet the requirements for a quarter wave design.

Once layer thicknesses meet the quarter wave criteria, the double light pass, reflected from layers and make the half wave conditions, in which the light intensity will be constructed or enhanced. But, the layer thickness 137.5 nm is not a physical thickness or geometrical thickness, rather, it calls optical thickness. In optical interference, only optical thickness comes into play.

Layer optical thickness is its physical thickness multiplied by its refractive indices. For example, the $SiO_2$ thickness is 958.86 angstroms, while the $NbO_2$ 599.08 angstroms. In general, the relatively-high refractive index $NbO_2$ means thinner physical thickness. In addition, the relatively-low refractive index material, $SiO_2$, also has a quarter wave thickness with respect to control wave of 550 nm.

In one embodiment, the enhanced aluminum reflecting layer 210 described as Al/HLHLH, where L is the relatively-low refractive index, and H is the relatively-high refractive index. As such, Al/HLHLH is five quarter wave layers, with first of $NbO_2$, and second of $SiO_2$, and third layer $NbO_2$, fourth layer $SiO_2$ and the outmost layer $NbO_2$ which is next to the incident media, air. With this design, at 550 nm the stack reflectivity is 93.53688%. In another design, for Al/HLHLHLHLH, the reflectivity of system is 98.54101%. In this way, it can be said that the pure aluminum's reflectivity is enhanced or increased.

In an exemplary implementation, a goal is to increase lamp lumens. As such, there are more than one wavelength. As such, as the lamps are designed, the full visible spectrum is considered. In addition, aluminum is a metal that has so-called induced absorption. As such, the design has to reduce any possible absorption wavelength where reflectivity will much be reduced. In one embodiment, thin film software can be implemented to perform these calculations. In addition, it is appreciated that the quarter wave film design is discussed for illustrative purposes. In other embodiments, other wave designs can be implemented.

As provided, at least one characteristic of the reflector 106, such as overall stack thickness, thickness of one or more layers, material of one or more layers, or number of layers, can be tuned (e.g., configured, arranged, designed, or defined according) to lighting system 100 geometry and optics within the system.

In one example, implementing current processes, reflecting layer 210 can be deposited over the inner surface of a current LED reflector system. Without vacuum break, add another 26 or more layers of thin films, alternating between the two different metal oxides, with for example $SiO_2$, as the relatively low refractive index and for example $TiO_2$ as the relatively high refractive index material.

In this example, there are a total of thirteen $SiO_2$ layers and another thirteen layers of the $TiO_2$ thin film layers. In this example, the relatively high refractive index material (e.g., $TiO_2$) is next to the reflecting layer 210 (e.g., the layer 212). In this example, the relatively low refractive index material (e.g., $SiO_2$) is the outermost layer (e.g., the layer 228). Each layer has specific thickness in order to realize high reflectivity as described herein.

It is appreciated that current conventional aluminum alone has only below 90%. The embodiments described herein implementing the stack 108 can increase its lumen output by 10 to 20%, by enabling more light rays to bounce on reflective surfaces. The increase can vary depending on the reflector/housing design.

As described herein, the geometrical factors can include a configuration (e.g., size and shape) and arrangement (e.g., positioning and orientation) of the reflector 106 in the system 100. The optical factors can include at least those resulting from the system geometry, such as the incident angles of light on the stack 108. In addition, the optical factors may also include color presence or distribution (e.g., wavelength range, or median wavelength, etc.) of the light arriving at the stacks.

In embodiments, reflector tuning (e.g., reflector stack tuning) can be implemented to include maximizing reflectivity and minimizing color separation of the light being reflected by the reflector 106.

A primary reflector stack characteristic to be tuned is, in many embodiments, the thickness of the stack layers 212, 214, 216, 218, 220, 222, 224, 226, 228. More particularly, the thickness for one or more of the layers of each reflector component is pre-selected based on an expected angle or angles (or angle range) of incidence at which light from the source (e.g., source 102 in FIG. 1) will impinge on the stack 108.

Most lighting systems result in emitted light propagating toward the reflector(s) along multiple lines. For these cases, calculations are configured to accommodate these realities. Calculations can be configured to consider, e.g., an angle at which most light will be incident on the stack, or an average or median angle at which light will be incident on the stack, the like or other approaches.

Further regarding tuning stack thicknesses, various stacks can be tuned differently based at least on their being at different places within the system geometry. At least one of the thicknesses of the layers 212, 214, 216, 218, 220, 222, 224, 226, 228 of the reflector 106 differs from a corresponding thickness or thicknesses of the layers of other reflectors in the system 100.

In some embodiments a thin-film stack, and/or just one or more layers thereof, will be configured thicker if, based on system geometry, light rays (e.g., most of the incident light) will impinge on the stack at higher incident angles. And vice versa—i.e., a thin-film stack, and/or just one or more select layers thereof, will be configured thinner if light rays will impinge on the stack at lower incident angles.

Thickness of a stack, and layers therein, affect how light rays are refracted within and so reflected by the reflector. A thinner stack will result in very-high quality light and color output (i.e., maximizing reflectivity and minimizing color separation) for light rays arriving, based on system geometry, at the reflector at only glancing or grazing incident angles. The optical benefits relate to wave theory and how the tuned layers refract light as desired in the reflecting act.

Conversely, then, a thicker stack will result in high-quality light and color output (i.e., maximizing reflectivity and minimizing color separation) for system 100 geometries by which light rays will arrive at the reflector at only closer-to-normal incident angles.

Output from each reflector, receiving light at different angles from the source, is a desired pattern of light, e.g., a full pattern resulting in a desired bright white appearance, directed to the target area, such as the ground for an overhead parking-lot light fixture. The beam pattern in most embodiments should include the constituent wavelengths (i.e., colors) in an equally distributed manner.

By way of example, with continued reference to FIGS. 1 and 2, at least one of the thicknesses of the layers 212, 214, 216, 218, 220, 222, 224, 226, 228 of the reflector 106 is less than corresponding thicknesses of layers of other reflectors in the system 100. This is responsive to a pre-determined geometry of the system 100, where the reflectors are desirably arranged (e.g., positioned and oriented) so that light from the source 102 arrives at the stack 108 at an incident angle 112. In this example, the incident angle 112 is less than an incident angle of light to arrive at another stack within the system 100.

The incident angle 112 of the ray 110 at the reflector 106 is relatively large, being approximately 60°. Some portions of the same reflector 106 receive light from the source 102 at greater incident angles, up to even about 90° (toward the lower edge of the reflector 106 in FIG. 1), for example, and at slightly lower angles, down to perhaps about 45° or 50° (toward the lower edge of the reflector 106 in FIG. 1).

Light incident on a surface at such relatively-high angles (e.g., 60°-90°, or a range including slightly lower angles, such as down to 55°, 50°, or 45°), can be referred to as near-normal, or nearer-normal, angles (or near-normal angle range), as these angles are relatively larger, closer to 90° than much lower angles.

The incident angle 112 of the ray 110 can also be relatively small, being approximately 15°, and perhaps up to 20° on the high end. Some portions of the reflector 106 receive light from the source 102 at lower angles, down to perhaps about 10°—e.g., toward the lower edge of the reflector 106 in FIG. 1.

Light incident on a surface at such relatively low angles (e.g., 10°-20°, or a range including slightly higher or lower angles, such as down to about 5° or even approaching 0°), can be referred to as glancing, or grazing angles, or a glancing or grazing angle range.

According to the relationship described above, with the geometry and optics of the system 100 being such that light will impinge on the first stack 108 at nearer-normal angles and light will impinge on another stack, for example, at more glancing angles the stack 108, or at least one or more layers thereof, would be designed thicker than the other stack, or corresponding layers thereof. As such the stack 108 can have an overall thickness greater of another stack in the system based on the relative profiles of incident angles on the stacks.

As mentioned, along with or instead of the overall thickness of the stack 108 being larger, one or more of the layers may be thicker based on the relative profiles of incident angles. As such one or more of the layers 212, 214, 216, 218, 220, 222, 224, 226, 228 in the stack 108 can have a thickness greater than the corresponding layers in another stack.

While distinctions are drawn primarily in the examples above between just two reflectors: a first reflector configured and arranged to receive nearer-normal angle light and another reflector to receive more glancing-angle light, it will be appreciated that the scenarios may be more complex. The system 100 may include more than one reflector 106, for instance.

The example system 100 comprises the single reflector 106, having only one type of stack 108, tuned as described herein. This embodiment can be distinguished from another embodiment in which different stacks are combined into a single reflector, such as by the distinct stacks sharing a common substrate or having connected substrates.

The stack 108 of the single reflector 106 can include dielectric layers having thicknesses tuned based on the geometry and optics. The optics may include, e.g., incident light angle, or angle or angle range at which most light from the source will impinge on the stack 208, and perhaps also color characteristics, e.g., distribution/levels of color (wavelengths) incoming and desired for outgoing.

In another embodiment, at least three reflectors are configured in the system 100 so that in a first arrangement, some rays of light arrive at near-normal angles at a first of the reflectors. In a second arrangement, other rays of light arrive at more-glancing angles at a second of the reflectors. In a third arrangement, still other rays of light arrive within an angle range being generally lower than those of the first arrangement and higher than those of the second arrangement.

The angles of the third arrangement can define near-normal angles, but just farther from normal than the first arrangement. The angles of the third arrangement could alternatively define glancing angles, but just higher angles than the second arrangement. In this case, assuming the primary function described above, the first stack of these three would have the greatest thickness (or one or more relatively thicker layers). The third stack would have the smallest thickness (or one or more layers relatively thinner) of the three. And the second stack would have a thickness (or layer thicknesses) intermediate that of the first and third stacks.

As another, contemplated, extension of the primary, two-reflector example, a single reflector can include two or more stacks, formed adjacent each other, or formed separately and connected or positioned directly adjacent each other. For these contemplated scenarios, the stacks may be formed on a common substrate, simultaneously or at separate times, such as using a separating mask, or formed separately on distinct substrates that are then connected or at least positioned adjacent each other.

In contemplated embodiments, at least one characteristic of the reflector (e.g., the stack) in addition to or instead of thickness, such as number of layers or material of one or more layers, is tuned (e.g., configured, arranged, designed, or defined as) to lighting system geometry and optics within the system. A goal for the contemplated embodiments can be essentially the same as the goals described herein.

For instance, one or more stack layer materials can be selected (or tuned) and/or a number of layers selected (or tuned) so that, based on system 100 geometry and optics, light rays are refracted within and so reflected overall by the reflector towards very-high quality light output and very-high quality color output (i.e., maximizing reflectivity and minimizing color separation). The tuning will result in one configuration (e.g., material(s) selection, number of layers, and/or layer thickness) for stacks onto which light rays will be more glancing, another when incident angles at the stack would be nearer to normal, and others are possible for any scenarios there between.

In one contemplated embodiment, in addition to or instead of one or more reflector characteristics being tuned as a function of system 100 geometry and intra-system optics, at least one aspect of system geometry and/or optics is tuned as a function of reflector characteristics. For instance, configuration (e.g., sizing, shaping) band/or arranging (e.g., positioning and/or orientation) of a reflector can be set based at least in part on reflector characteristics, such as the thickness, material, or number of layers of the reflector stack. The resulting goals would be like those described above—e.g., to achieve a very-high quality light and color output (i.e., maximizing reflectivity and minimizing color separation).

Losses in light quality (color and intensity) can be quantified. Turning to the figures and, more particularly to the first figure, FIG. 1 is a data chart 100 showing reflectivity, or reflectance (y-axis 102), or percentage of light reflected, of various wavelengths (x-axis 104) of two rays of light being the same, and reflecting off of the same surface, but at two different angles. A first 106 of the two rays impinges on the reflecting surface at 60° and a second ray 108 impinges at only 15°.

As can be seen in FIG. 1, a relatively high percentage of the light between about 380 nanometer (nm) and 625 nm wavelengths is reflected for both rays 106, 108 (i.e., at both angles). Wavelengths at the lower end of the visible spectrum, e.g., from slightly above 400 nm to below, include indigo and violet, while orange starts at the other end from yellow around 600 nm, transitioning to more red approaching and exceeding 650 nm.

Within this context, FIG. 1 depicts that while the reflectivity, or reflectance 102 (y-axis value) for the first ray 106 (the 60° incident ray) remains high for even the higher, more red, wavelengths of the ray 106, the reflectance for the second ray 108 (the 15° incident ray) plummets for the higher wavelengths of the ray 108. The result is undesirable color, including insufficient red light, and so less overall intensity and color uniformity for the light 108 being reflected after arriving at the lower angle.

Figure 3:
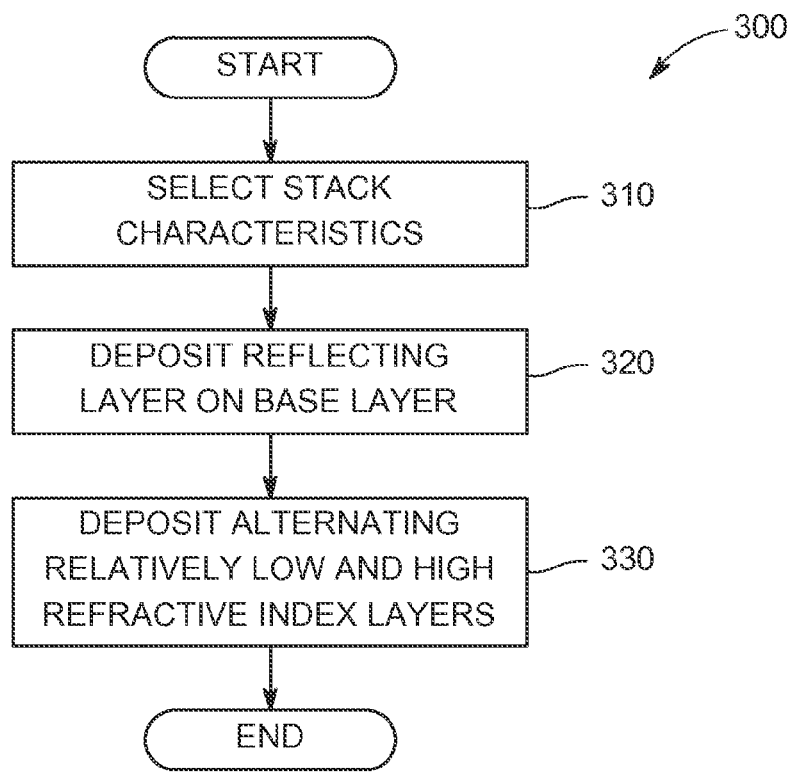
FIG. 3 illustrates a flow chart of a method for forming the lighting system the reflector coating of FIG. 2.

FIG. 3 schematically depicts a flow of a process or method 300 for forming a lighting system, or aspects thereof, according to the present technology. The flow illustrated and described includes algorithms for performing various operations.

It should be understood that the steps of the method 300 are not necessarily presented in any particular order and that performance of some or all the steps in an alternative order is possible and is contemplated. The steps are presented in the demonstrated order for ease of description and illustration. Steps can be added, omitted and/or performed simultaneously without departing from the scope of the appended claims. The illustrated method 300 could be ended at any time.

At block 310, the optical characteristics of the system 100 are selected. As described herein, a number of layers are selected for the stack 108 such that the reflectivity of the system 100 is increased 10-20% than that of aluminum or silver alone. The stack 108 can include up to 30 or more thin film layers, which alternate between a relatively high refractive index material and a relatively low refractive index material, for example, $SiO_2$ as the relatively low refractive index material, and $TiO_2$ or $Nb_2O_5$ as the relatively high refractive index material.

It is appreciated that several relatively low and relatively high refractive index materials are described herein, and that other materials are contemplated in other embodiments. It should be appreciated that there are an infinite number of combinations, or permutations, of stack characteristics—i.e., combinations of various numbers of layers, thicknesses of layers, materials, and the like. The base reflector surfaces 200 may include any of a variety of materials, such as but not limited to an injection molded plastic substrate material, glass, low cost polycarbonate and the like. As such, the desired characteristics of the stack are selected.

As further described herein, other characteristics are chosen to tune the stack 108 for desired implementation. For example, in one embodiment, a planned or expected quality and incident angle for light impinging on a reflector, along with a desired light output (if not default white), and a number of dielectric layers to use and their materials and thicknesses can be selected.

Generally, the lighting system 100 characteristics that can be obtained include any feature of the lighting system 100. System characteristics can include, for instance, a type and an arrangement—e.g., positioning and orientation—of light source(s) to be used in the system 100. The characteristics can also include a number and arrangement of reflector components to be used in the system 100.

Regarding the type of the light source, while a single lighting component 102 is shown schematically for simplicity of illustration in FIG. 1, the light source can include multiple bulbs, diodes, or other lighting elements, as mentioned. The light source(s) can be designed to each emit light at any desired color or color combination. For embodiments in which the light source 102 includes multiple lighting elements, the elements may be arranged in any conventional or to-be-created manner, such as in a lighting array or cluster.

In some embodiments, some system characteristics are not tuned. In an embodiment in which only stack thickness is tuned, for example, any or all other lighting-system design characteristics s (e.g., material, number of layers) can be set, or static, for the generating operation.

The system characteristics are, in one embodiment, set for the generating according to desired system qualities, such as direction and intensity of system output light. Other qualities considered can include, e.g., system weight, size, shape, and cost.

As also mentioned, in one embodiment, one or more aspects of the system design and optics can be tuned as a function of (or based on, controlled by, dependent on, etc.) reflector characteristics. For instance, as an example, based on a determination to use a certain type of reflector stack, or base substrate, a positioning or orientation of the reflector and/or of the light source of the lighting system 100 can be set.

In addition, at least one reflector characteristic is tuned to lighting system 100 geometry and optics within the system 100. As referenced, the tunable characteristics can include, e.g., stack thickness, thickness of one or more stack layers, material of one or more layers, and number of layers.

Again, the geometric factors of the lighting system 100 available for consideration can include a configuration (e.g., size and shape) and arrangement (e.g., positioning and orientation) of the reflector 106 in the system 100.

The optical factors can include at least those resulting from the system geometry, such as the incident angles of light on the stack 108.

The optical factors can also include color presence or distribution (e.g., wavelength range, or median wavelength, etc.) of the light to arrive at the stacks. LEDs for instance, can include various color dyes, having various light outputs. In some cases, the light source, e.g., LED, includes multiple dyes, or otherwise exhibits various separation patterns, or color properties, in the light leaving the source for the reflector(s).

Reflector characteristics, such as stack layer thickness(es) or number of layers, can be tuned based in part on the type of light to arrive at the stack. In some implementations, a non-white lighting effect is desired, such as if a light with more blue or more red, after reflection, is desired. Thus, whether white light or another type is desired as output, the desired light output quality/ies can, along with quality/ies of the light input, be considered as a factor upon which the stack tuning is be based.

In one embodiment, tuning can include maximizing reflectivity and minimizing color separation of the light being reflected by the reflector 106.

A primary reflector characteristic described above as being tunable according to the present technology is the thicknesses of the stack 108, or at least thicknesses of layers of the stack 108. Regarding tuning the thickness of each stack 108, the stack thickness, or layer(s) thereof, are configured based on lighting system 100 geometry and optics.

The tuning of stack thicknesses is described above in connection with FIGS. 1 and 2. As provided, an angle or angle range of most light to impinge on a reflector, or a median or an average angle of all of the light that impinges on the reflector 106, is considered in configuring the thickness of the stack 108 or of one or more layers 212, 214, 216, 218, 220, 222, 224, 226, 228 of the stack 108.

As also described, regarding tuning stack thickness based on system geometry and optics, in some embodiments, a thin-film stack, and/or just one or more layers thereof, can be configured thicker if light rays (e.g., most of the incident light) impinge on the stack at more glancing incident angles. And vice versa—i.e., a thin-film stack, and/or just one or more select layers thereof, will be configured thinner if light rays impinge on the stack at more perpendicular incident angles.

Example angle ranges (e.g., glancing angle ranges and nearer-normal angle ranges) are described above. FIGS. 1 and 2 show the stack 108 of the reflector 106 being thicker and thinner according to a tuning of the present technology, based on at least intra-system geometry.

Stack thickness tuning is in some embodiments a preferred manner of tuning the system reflectors 108 to system geometry and optics. The tuning is performed for achieving very-high quality light and color output—i.e., maximizing reflectivity and minimizing color separation.

Other reflector 106 characteristics can be tuned, to the geometry and optics of the lighting system 100, for achieving the same goals (e.g., very-high quality light and color output).

Selecting stack characteristics can also include tuning a number of thin-film layers (e.g., alternating between high and low refractive index dielectric layers) to the geometry and optics of the lighting system 100. The tuning is implemented to achieve very-high quality light and color output—i.e., maximizing reflectivity and minimizing color separation.

Selecting stack characteristics can also include tuning a material of the thin-film layers to the geometry and optics of the lighting system 100. The tuning is implemented to achieve very-high quality light and color output—i.e., maximizing reflectivity and minimizing color separation.

Selecting stack characteristics can also include tuning a shape of a reflector (e.g., shape of a stack) to the geometry and optics of the lighting system 100, toward the same goals.

Though not discussed or shown within the tuning operation, one skilled in the art will appreciate that the tuning can include tuning other reflector characteristics, beyond stack thickness and the others referenced within the scope of the present technology, toward the stated goals—e.g., achieving very-high quality light and color output.

At block 320, the reflecting layer 210 is deposited on the base reflector surface 200. In one embodiment, any conventional deposition technique can be implemented to deposit the reflecting layer 210.

In one embodiment, the reflecting layer 210 can be formed implementing an aluminum metal sheet. Conventional aluminum sheets can display high reflective qualities with specular finish that are needed by light beam requirements. The aluminum sheet can be bent to make cone or parabolic shape for light output and beam patterns. Some conventional aluminum sheet manufacturers provide protective materials on the aluminum sheets to protect the aluminum from harsh environmental conditions and well as to enhance aluminum reflectivity. In one embodiment, the deposition that can be implemented to introduce the materials atop the aluminum sheet can include but is not limited to sputtering.

In another embodiment, the reflecting layer 210 can be deposited on the base reflector surface 200 as a think film aluminum layer via a vacuum coating process. For example, one vacuum coating process is thermal evaporation, in which that Aluminum strips hang on a tungsten wire. By applying electrical power, usually low voltage and high current, the aluminum strip is first melted and then vaporized. As a result, the reflecting layer 210 is formed on the base reflector surface 200. As described above with respect to the protective layer on the aluminum sheet, sputtering can be implemented to form the reflecting layer 210 on the base reflector surface 200.

At block 330, the stack layers 212, 214, 216, 218, 220, 222, 224, 226, 228 are deposited as described herein. In one embodiment, any conventional deposition techniques such as but not limited to sputtering, chemical vapor deposition (CVD) and the like can be implemented to deposit the stack layers 212, 214, 216, 218, 220, 222, 224, 226, 228. In one embodiment, the stack layers 212, 214, 216, 218, 220, 222, 224, 226, 228 are deposited on the reflecting layer 210 without a vacuum break.

In one embodiment, the stack 108 is also known as a long-wave-pass filter, or cold mirror. The stack 108 can be formed by various conventional fabrication techniques such as Low Pressure Chemical Vapor Deposition (LPCVD). In another embodiment, the stack 108 can be formed by electric beam evaporation, or e-beam.

The high-energy electric beam is focused on oxides material, such as the relatively low and high refractive index materials. The oxides powder or pieces are melted and vaporized, and the film is formed on the relatively lower temperature-reflecting layer 210. The oxide materials implemented for both the relatively low and high refractive index materials can withstand temperatures in the 300° C. to 500° C. range. Some film thickness control can precisely control layer thickness according to the cold mirror design.

As described herein, the stack 108 is formed to reflect the entire visible spectrum. In another embodiment, in which the reflecting layer 210 is aluminum as described herein, the thin film design has a similar result as a third cold mirror, but in the infrared (IR) spectrum, in which the enhanced aluminum structure reflects IR light. This feature may be important because IR light through the cold mirror could damage the lamp fixture.

Figure 4:
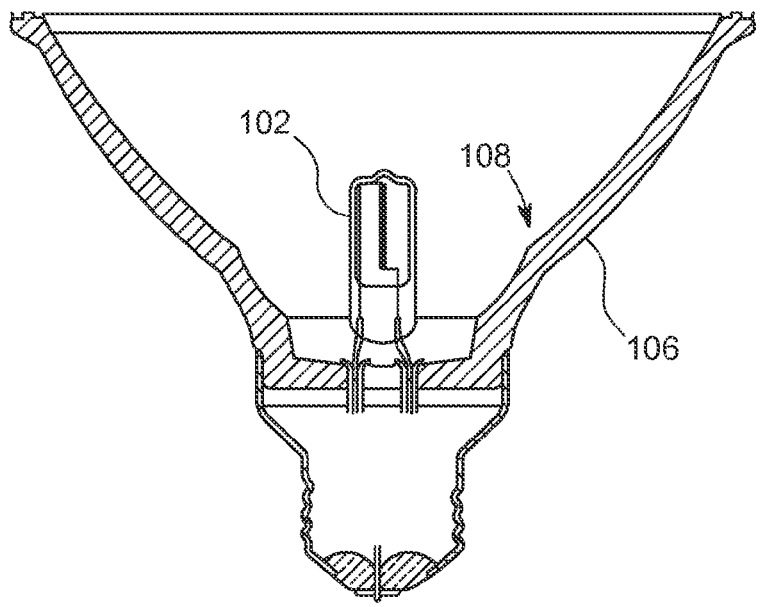
FIG. 4 is a chart showing reflectance vs. wavelength of two instances of reflected light.

FIG. 4 illustrates an example housing 400 in which the system 100 can be implemented. As illustrated, the housing 400, which can be an LED light bulb, includes the light source 102, the reflector 106 and the stack 108.

Benefits of the present technology comprise achieving the goals mentioned, including very-high quality light and color output—i.e., maximizing reflectivity and minimizing color separation.

Figure 5:
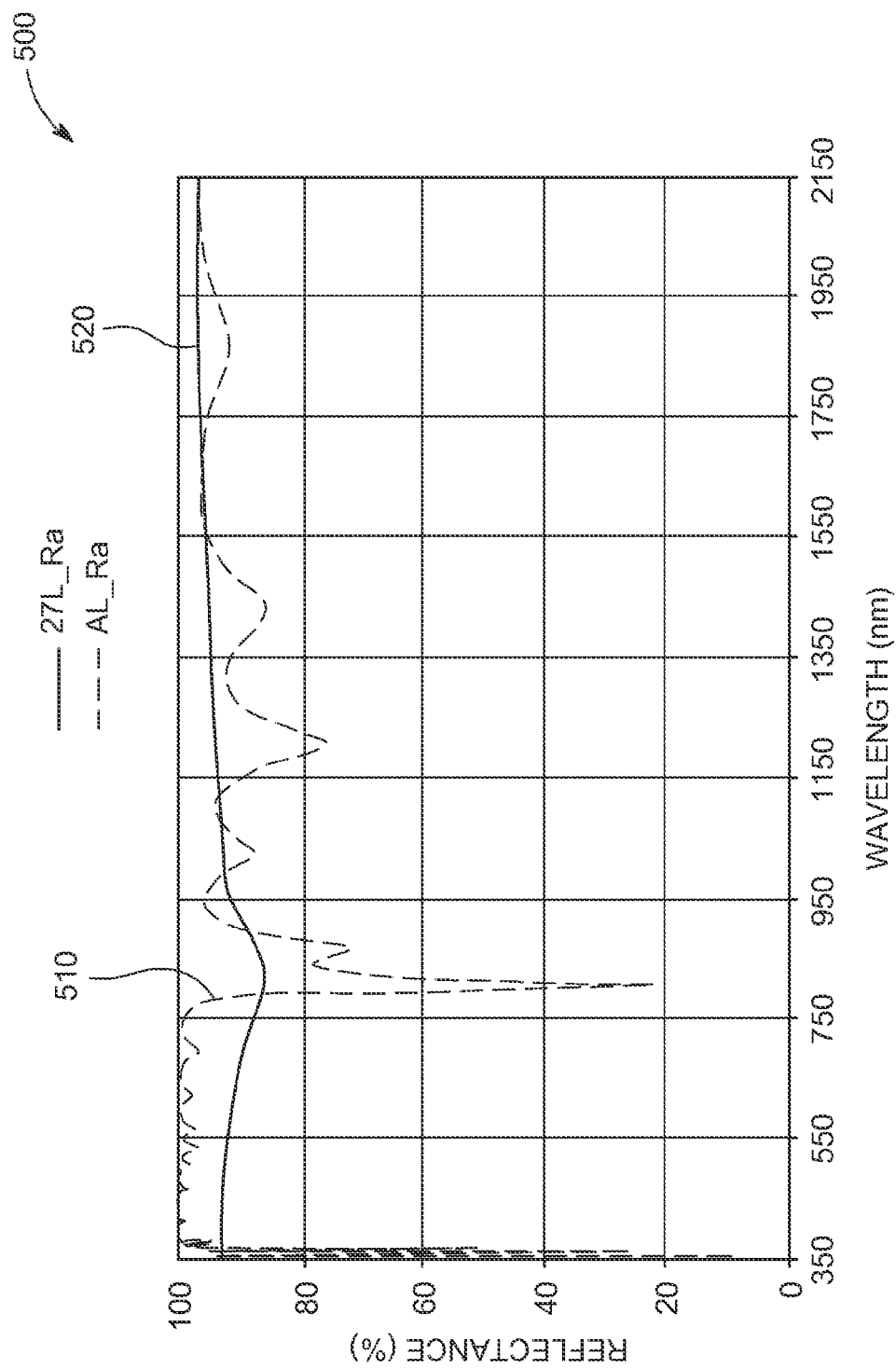
FIG. 5 is a graphical illustration of example benefits of using high-performance reflectors designed according to the embodiments.

FIG. 5 illustrates a chart 500 showing example benefits of using high-performance reflectors designed according to the present technology. The line 510 represents a plot of reflectance versus wavelength of the enhanced aluminum design of the present technology. The line 520 represents a plot of reflectance versus wavelength of pure aluminum coating, theoretical reflectance in UV, visible, and IR spectrum. The line 410 indicates that embodiments described herein provide high reflectivity over a wide spectrum from ultraviolet (UV) to IR.

In particular, it can be seen that the reflectivity is increased close to 100% in the visible spectrum 380 nm to 760 nm. The goal of very-high quality light and color output—i.e., maximizing reflectivity and minimizing color separation—is thus achieved. As such, the embodiments described herein provide a high reflectivity solution that adds stacks of high melting point alternating oxide layers atop an aluminum-reflecting layer. The embodiments described herein provide a solution over high reflectivity silver solutions, which suffer from tarnishing.

The stack 108 described herein demonstrates high system efficiency, to as high as greater than 99-100%, which is equivalent to silver coating of single bounce reflectivity of 97 to 98%. It is appreciated that more light rays bounce to the reflective surface, thereby providing the increased reflectivity. As such, aluminum is retained as the reflective surface as compared to silver, thereby providing the further advantage of high durability of aluminum as well as high melting point temperatures of the relatively low and high refractive index materials, providing resistance to harsh environments. As such, high performance is achieved for special LED lighting such as high cost street lighting and parking lot lighting or other lighting.

In one example, in the auto industry, aluminum coatings are implemented for headlamps. The lamp hosing, usually plastic, has a deposited aluminum coating-reflecting layer. But common plastic doesn't have the specular surface needed, therefore a polymer coating is used to improve the surface finishing. In addition, other similar polymers are applied to the aluminum-reflecting layer. The polymers are used to protect aluminum because aluminum reacts with both acid and alkaline environments.

The polymer topcoats reduce reflectivity from 5 to 10%. The present technology reduces loss because the 30 plus layer oxides on top of the aluminum reflecting layer provides better protection than polymer topcoats. As such, the present technology described herein not only raised aluminum reflectivity by 10-20%, similar to a silver coating, but also eliminated polymer topcoats, which eliminates at least another and 5% of light loss.

While other reflector configurations may be used, there are advantages to using a thin-film arrangement, and dielectric coatings therein. One advantage is that dielectric coatings are extremely robust to temperature and environment, especially compared, e.g., to materials such as polymers.

The present technology can also be implemented at relatively low costs of production. Existing design and manufacturing hardware and equipment, and some software, can be used, for instance.

Opportunities for better reflective lighting according to the present technology comprise area lighting applications including outdoor lighting, such as in fixtures for parking lots, parks, boardwalks, stadiums, highways and other roadways, etc. Lighting systems of the present technology can also be used in other manners, such as for indoor applications and in automotive or other transportation vehicles.

Those skilled in the art, particularly in light of the foregoing teachings, may make alternative embodiments, examples, and modifications that would still be encompassed by the technology. Further, it should be understood that the terminology used to describe the technology is intended to be in the nature of words of description rather than of limitation.

Those skilled in the art will also appreciate that various adaptations and modifications of the preferred and alternative embodiments described above can be configured without departing from the scope and spirit of the technology. Therefore, it is to be understood that, within the scope of the appended claims, the invention may be practiced other than as specifically described herein.

We claim:

1. A reflector lighting apparatus, comprising:
    an LED array light source;
    a reflector having a aluminum reflecting layer deposited on a base layer; and
    a thin-film layered stack positioned directly adjacent the aluminum reflecting layer, wherein the thin-film layered stack includes an even number of layers of 26 or more layers;
    the thin-film layered stack comprising:
        a first oxide layer deposited on the aluminum reflecting layer;
        a second oxide layer deposited on the first oxide layer; and
        an alternating plurality of a relatively low refractive index oxide layer material and a relatively high refractive index oxide layer material deposited on the second oxide layer;
        wherein the first oxide layer comprises a relatively high refractive index oxide material, and wherein a final layer of the thin-film layered stack comprises a relatively low refractive index oxide material.

2. The apparatus of claim 1, wherein the relatively high refractive index oxide layer material has a thickness of about 30 nm to about 200 nm, and the relatively low refractive index oxide layer material has a thickness of from 50 nm to 300 nm.

* * * * *